(12) United States Patent
Bouche

(10) Patent No.: US 10,229,850 B1
(45) Date of Patent: Mar. 12, 2019

(54) CUT-FIRST APPROACH WITH SELF-ALIGNMENT DURING LINE PATTERNING

(71) Applicant: GLOBALFOUNDRIES Inc., Grand Cayman (KY)

(72) Inventor: Guillaume Bouche, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/860,231

(22) Filed: Jan. 2, 2018

(51) Int. Cl.
*H01L 21/033* (2006.01)
*H01L 21/768* (2006.01)

(52) U.S. Cl.
CPC .... *H01L 21/76816* (2013.01); *H01L 21/0332* (2013.01); *H01L 21/0335* (2013.01); *H01L 21/0337* (2013.01); *H01L 21/76877* (2013.01)

(58) Field of Classification Search
CPC ............. H01L 21/0332; H01L 21/0335; H01L 21/0337; H01L 21/76816; H01L 21/76877–21/76885
See application file for complete search history.

(56) References Cited

U.S. PATENT DOCUMENTS

| 9,818,623 B2 | 11/2017 | Stephens et al. |
| 2016/0013103 A1* | 1/2016 | Huang ................ H01L 21/0332 438/666 |

* cited by examiner

*Primary Examiner* — Daniel P Shook
(74) *Attorney, Agent, or Firm* — Thompson Hine LLP; Anthony Canale

(57) ABSTRACT

Methods of patterning a structure. A first hardmask layer is deposited on a second hardmask layer. A cut is formed that penetrates through the first hardmask layer and the second hardmask layer. A block mask is formed in the cut. The first hardmask layer is patterned to form first lines penetrating through the first hardmask layer to the second hardmask layer with at least one of the first lines superimposed on the block mask. After patterning the first hardmask layer, the second hardmask layer is patterned to transfer the first lines from the first hardmask layer to the second hardmask layer to form second lines penetrating through the second hardmask layer. The second hardmask layer is etched with an isotropic etching process that removes the second hardmask layer selective to the first hardmask layer such that the second lines are widened relative to the first lines.

20 Claims, 5 Drawing Sheets

CUT-FIRST APPROACH WITH SELF-ALIGNMENT DURING LINE PATTERNING

BACKGROUND

The present invention relates to integrated circuits and semiconductor device fabrication and, more specifically, to methods of patterning a structure.

A back-end-of-line (BEOL) interconnect structure may be used to connect device structures fabricated on a substrate during front-end-of-line (FEOL) processing with each other and with the environment external to the chip. Self-aligned patterning processes used to form a BEOL interconnect structure involve mandrels as sacrificial features that establish a feature pitch. Spacers, which have a thickness that is less than a dimension permitted by the current ground rules for optical lithography, are formed adjacent to the vertical sidewalls of the mandrels. After selective removal of the mandrels, the spacers are used as an etch mask to etch an underlying hardmask to define mandrel lines over areas from which the mandrels are removed and non-mandrel lines over areas between the spacers. The pattern of mandrel and non-mandrel lines is transferred from the hardmask to an interlayer dielectric layer as trenches in which the wires of the BEOL interconnect structure are formed.

Cuts may be formed in mandrels with a cut mask and etching in order to section the mandrels before the spacers are formed and to define gaps in the cut mandrels. Non-mandrel cuts may also be formed in the hardmask itself and define gaps that are filled by dielectric material when the spacers are formed. The gaps may be subsequently used to produce wires in the patterned interlayer dielectric layer that are spaced apart at their tips with a tip-to-tip spacing.

Improved methods of patterning a structure, such as a BEOL interconnect structure, are needed.

SUMMARY

In an embodiment of the invention, a method includes depositing a first hardmask layer on a second hardmask layer, forming a cut that penetrates through the first hardmask layer and the second hardmask layer, and forming a block mask in the cut. The method further includes patterning the first hardmask layer to form a plurality of first lines penetrating through the first hardmask layer to the second hardmask layer with at least one of the first lines superimposed on the block mask. After patterning the first hardmask layer, the second hardmask layer is patterned to transfer the first lines from the first hardmask layer to the second hardmask layer to form a plurality of second lines penetrating through the second hardmask layer. The method further includes etching the second hardmask layer with an isotropic etching process that removes the second hardmask layer selective to the first hardmask layer such that the second lines are widened relative to the first lines.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 2A is a top view in which FIG. 2 is taken generally along line 2-2.

FIG. 5A is a top view in which FIG. 5 is taken generally along line 5-5.

FIG. 10A is a top view in which FIG. 10 is taken generally along line 10-10.

DETAILED DESCRIPTION

Figure 1:
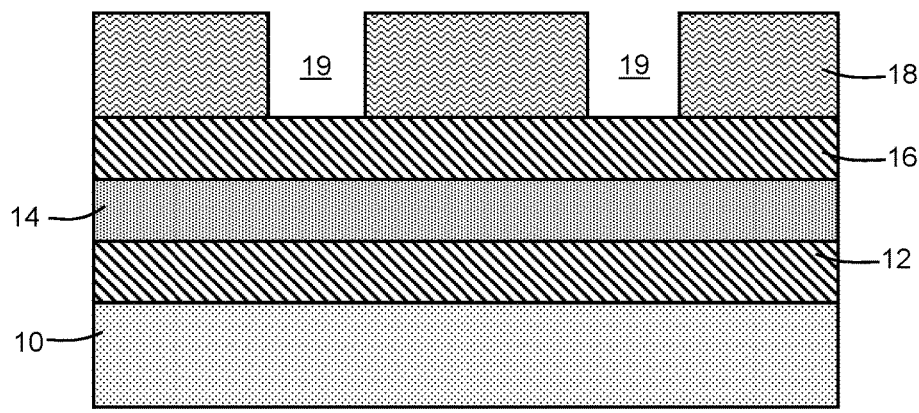
FIGS. 1-10 are cross-sectional views of a structure at successive stages of a processing method in accordance with embodiments of the invention.

With reference to FIG. 1 and in accordance with embodiments of the invention, an interlayer dielectric layer 10 may be comprised of an electrically-insulating dielectric material, such as hydrogen-enriched silicon oxycarbide (SiCOH) or another type of low-k dielectric material. The interlayer dielectric layer 10 may be located on a substrate (not shown) that includes device structures fabricated by front-end-of-line (FEOL) processing to form an integrated circuit.

Hardmask layers 12, 14, 16 are formed in a layer stack that is located on the top surface of the interlayer dielectric layer 10. The hardmask layer 14 is composed of a material that can be etched selective to the materials of the hardmask layers 12 and 16, and the materials of the hardmask layers 12 and 16 are each composed of a material that can be etched selective to the material of the hardmask layer 14. In an embodiment, the hardmask layer 12 and hardmask layer 16 may be comprised of a metal, such as titanium nitride (TiN), that may be deposited by physical vapor deposition (PVD). In an embodiment, the hardmask layer 14 may be composed of a dielectric material, such as silicon dioxide ($SiO_2$), that may be deposited by chemical vapor deposition (CVD). As used herein, the term "selective" in reference to a material removal process (e.g., etching) denotes that the material removal rate (i.e., etch rate) for the targeted material is higher than the material removal rate (i.e., etch rate) for at least another material exposed to the material removal process.

A cut mask 18 is formed on a top surface of the hardmask layer 16. The cut mask 18 may include a lithography stack that is patterned to form shapes or openings 19 that are situated at the intended locations for cuts to be subsequently formed in the hardmask layer 16. The lithography stack of the cut mask 18 may include one or more material layers, such as a spin-on hardmask, an anti-reflective coating, and a photoresist, as well as additional layers as needed.

Figure 2:
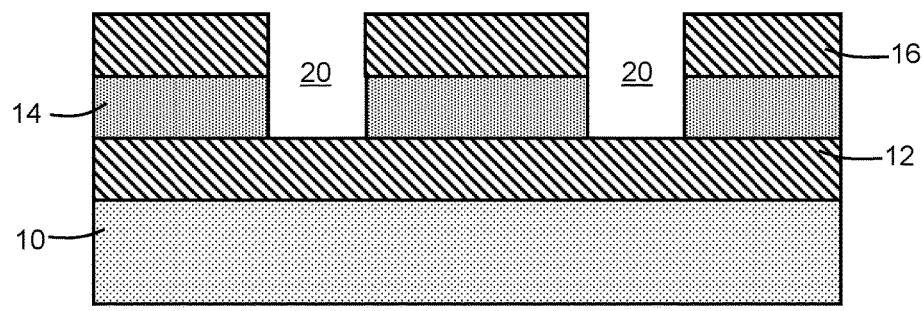
Figure 2A:
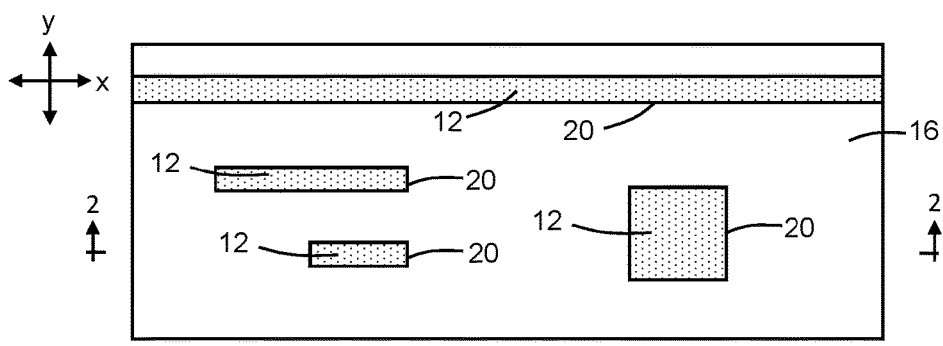

With reference to FIGS. 2, 2A in which like reference numerals refer to like features in FIG. 1 and at a subsequent fabrication stage of the processing method, cuts 20 are formed that extend through the hardmask layer 16 and the hardmask layer 14. The cut 20 may be formed in the hardmask layer 16 with an etching process, such as reactive-ion etching (RIE), that removes the material of the hardmask layer 16 selective to the material of the hardmask layer 14. The cut 20 may be formed in the hardmask layer 14 with an etching process, such as reactive-ion etching (ME), that removes the material of the hardmask layer 14 selective to the material of the hardmask layer 12 and hardmask layer 16.

The cuts 20, which are formed at the location of the openings 19 in the cut mask 18, extend completely through the hardmask layer 16 and the hardmask layer 14 to the top surface of the hardmask layer 12. The cuts 20 expose respective areas on the top surface of the hardmask layer 12 from which the materials of the hardmask layers 14, 16 are removed by the etching processes. The cut mask 18 is stripped after the cuts 20 are formed. The cuts 20 may have different sizes, and each of the cuts 20 may be characterized by dimensions in a coordinate frame, such as a length in a given direction (e.g., an x-direction) and a width in another given direction (e.g., a y-direction transverse to the x-direction) in an x-y coordinate frame. The widths of the cuts 20 may determine tip-to-tip distances between wires subsequently formed in the interlayer dielectric layer 10, and the lengths of each of the cuts 20 may determine a number of lines that are cut.

Figure 3:
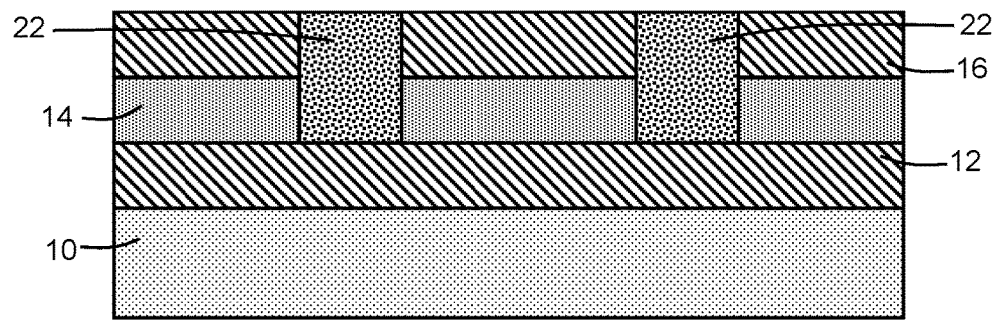

With reference to FIG. 3 in which like reference numerals refer to like features in FIG. 2 and at a subsequent fabrication stage of the processing method, the cuts 20 are filled with respective sections of a layer of gap-fill material to form block masks 22. The gap-fill material may be composed of a layer of dielectric material, such as silicon nitride ($Si_3N_4$), deposited by flowable chemical vapor deposition (FCVD) and either planarized by chemical mechanical polishing (CMP) or etched back to be coplanar with the top surface of the hardmask layer 16. The cuts 20 are fully filled and plugged by the gap-fill material independent of their dimensions, which may be selected during their patterning to promote the complete filling. In an alternative embodiment, the block masks 22 may be formed by selective growth of their constituent material from the exposed areas on the top surface of the hardmask layer 12.

Figure 4:
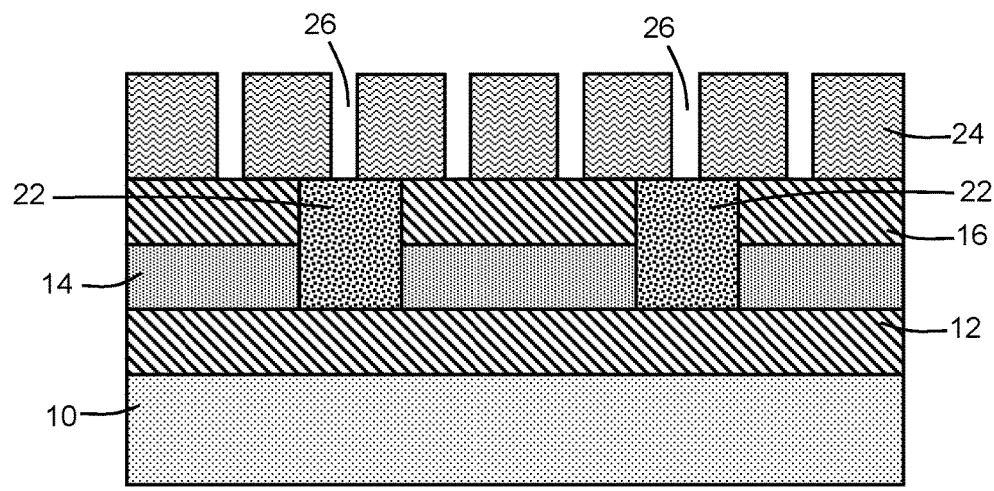

With reference to FIG. 4 in which like reference numerals refer to like features in FIG. 3 and at a subsequent fabrication stage of the processing method, an etch mask 24 is formed on the planarized top surfaces of the hardmask layer 16 and block masks 22. The etch mask 24 may include a lithography stack that is patterned to form openings 26, that are situated at the intended locations for lines to be subsequently formed in the hardmask layer 16. The lithography stack of the etch mask 24 may include one or more material layers, such as a spin-on hardmask, an anti-reflective coating, and a photoresist, as well as additional layers as needed. The openings 26 in the etch mask 24 may be constructed as a set of parallel lines.

Figure 5:
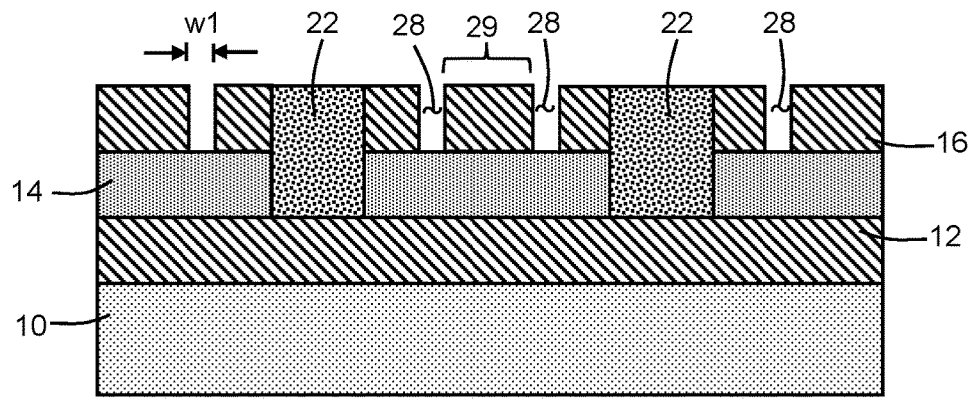
Figure 5A:
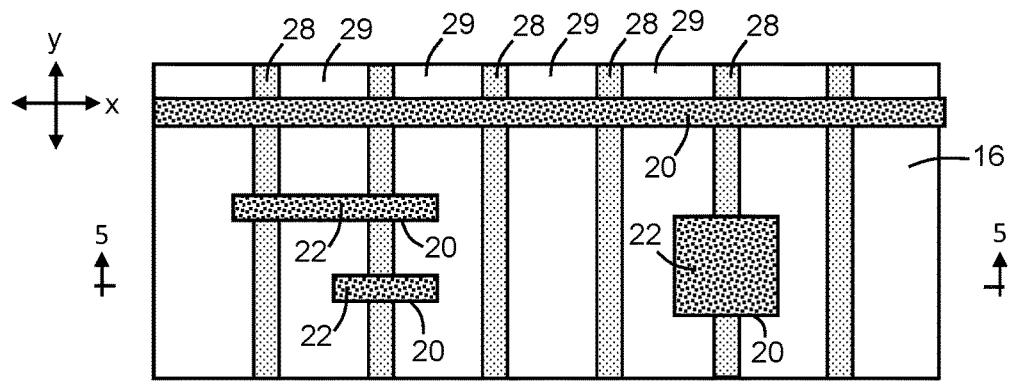

With reference to FIGS. 5, 5A in which like reference numerals refer to like features in FIG. 4 and at a subsequent fabrication stage of the processing method, lines 28 are formed in the hardmask layer 16 with an etching process, such as reactive-ion etching (RIE), that removes the material of the hardmask layer 16 selective to the materials of the hardmask layer 14 and the block masks 22. The lines 28, which are formed at the location of the openings 26 in the etch mask 24, extend completely through the hardmask layer 16 to the top surface of the hardmask layer 14. The lines 28 expose respective areas on the top surface of the hardmask layer 14 over which the material of the hardmask layer 16 is removed by the etching process. The etch mask 24 is stripped after the lines 28 are formed. Alternatively, the lines 28 may be formed by a multiple patterning technique, such as self-aligned double patterning (SADP), self-aligned double patterning (SAQP), SADP+LE (Litho-Etch) patterning, LELELE triple patterning, EUV patterning, etc.

The lines 28 are overlaid and superimposed on the block masks 22 of gap fill material such that each of the block masks 22 interrupts the continuity of one or more of the lines 28 in the y-direction. The lines 28 are self-aligned with the block masks 22 defining cuts in the lines 28. The lines 28 are linear features that are aligned parallel to each other in the y-direction, and that may have a uniform width and spacing (i.e., pitch) in the x-direction. The width, w1, of the lines 28 is selected to be less than the intended width of the complementary lines that, after a resizing operation, are subsequently formed in the interlayer dielectric layer 10. In an embodiment, the lines 28 may have a width that is equal to 25% of the intended width for the complementary lines that are subsequently formed the interlayer dielectric layer 10. The lines 28 are separated by spaces 29 that are wider than the spaces of the complementary lines that are subsequently formed in the interlayer dielectric layer 10.

Figure 6:
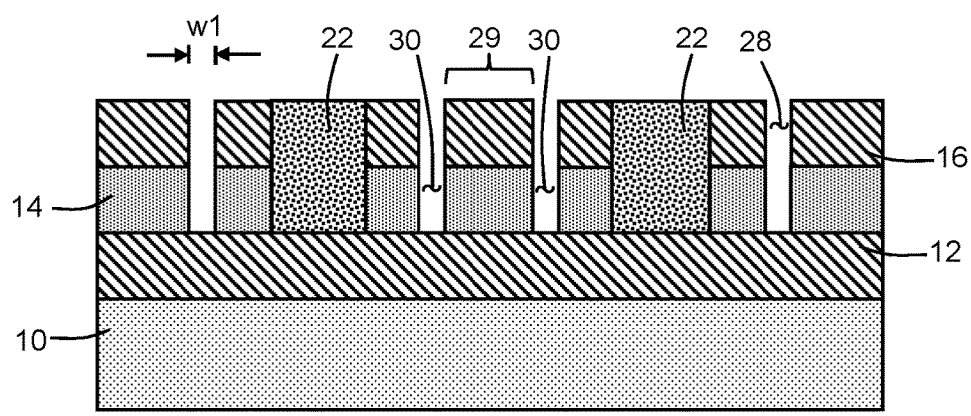

With reference to FIG. 6 in which like reference numerals refer to like features in FIG. 5 and at a subsequent fabrication stage of the processing method, the lines 30 are patterned in the hardmask layer 14 with an anisotropic etching process, such as reactive ion etching (ME), that is directional and that relies on the patterned hardmask layer 16 and the block masks 22 as an etch mask. The etching process removes the material of the hardmask layer 14 selective to the materials of the hardmask layer 12, hardmask layer 16, and block masks 22. The lines 30, which are formed at the location of the lines 28 in the hardmask layer 16, extend completely through the hardmask layer 14 to the top surface of the hardmask layer 12. The lines 30 expose respective areas on the top surface of the hardmask layer 12 over which the material of the hardmask layer 14 is removed by the etching process. The lines 30 have the same width, w1, as the lines 28 in the x-direction, and the lines 30 are separated by spaces dimensionally equal to the spaces 29 in the x-direction. Some of the lines 30 are lengthwise interrupted in the y-direction by portions of the block masks 22.

The patterning of the cuts in the lines 30 arising from the block masks 22 is performed while the lines 28 and 30 are narrow, and before widening, when the spaces 29 between adjacent lines 28 (and therefore the spaces between adjacent lines 30 in the hardmask layer 14) are comparatively large. The enhanced-width spaces 29 between the lines 28 reduce edge placement error that could otherwise cause the block masks 22 to unintentionally partially form a cut in an adjacent line 30.

Figure 7:
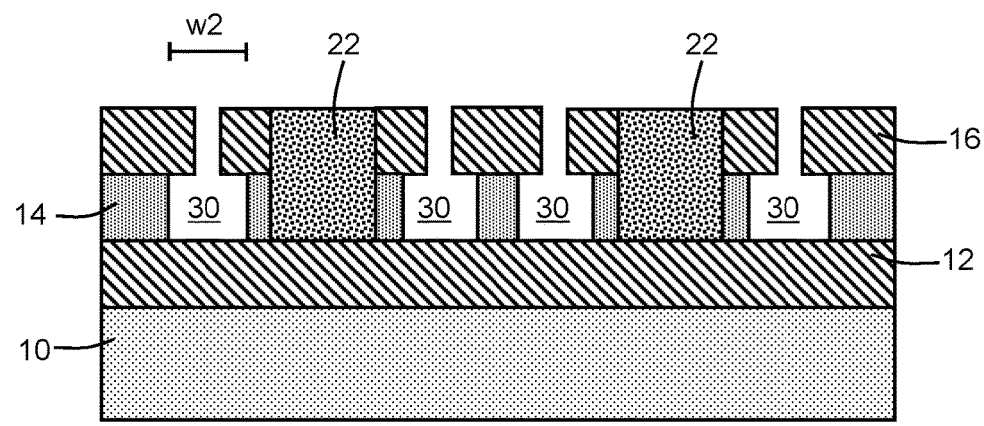

With reference to FIG. 7 in which like reference numerals refer to like features in FIG. 6 and at a subsequent fabrication stage of the processing method, the width of the lines 30 is increased from the original width to a larger width, w2, using an isotropic etch process that removes the material of the hardmask layer 14 selective to the materials of the hardmask layer 12, hardmask layer 14, and block masks 22. The isotropic etching process includes a horizontal etch component, in additional to a vertical etch component, that removes the material of the hardmask layer 14 such that the widened lines 30 undercut the hardmask layer 16 at the side edges of the lines 28. The isotropic etching process may be a wet chemical etching, a dry etching process (e.g., reactive ion etching (RIE), or another type of etching process capable of laterally recessing the hardmask layer 14 with etch selectivity. Due to the etch selectivity of the material of the block masks 22 relative to the material of the hardmask layer 14, the lengths of the tip-to-tip or end-to-end cuts in the lines 30 at the locations of the block masks 22 and in the y-direction parallel to the lines 30 are preserved (i.e., unchanged) because the length dimension of the block masks 22 is unchanged. The lines 30 are trimmed or resized to provide a width that is equal to the width in the design specification for the interconnects (i.e., wires) to be subsequently formed in the interlayer dielectric layer 10.

The lines 28 are thinner than the lines 30, and the spaces 29 are larger than the spaces between the lines 30. The change in the width dimension is reflected in the pattern of lines and spaces that are subsequently printed at the desired width in the interlayer dielectric layer 10. The lines 28 are formed at the same pitch as the interconnects subsequently printed in the interlayer dielectric layer 10 using the widened lines 30 that are transferred to the interlayer dielectric layer 10.

Figure 8:
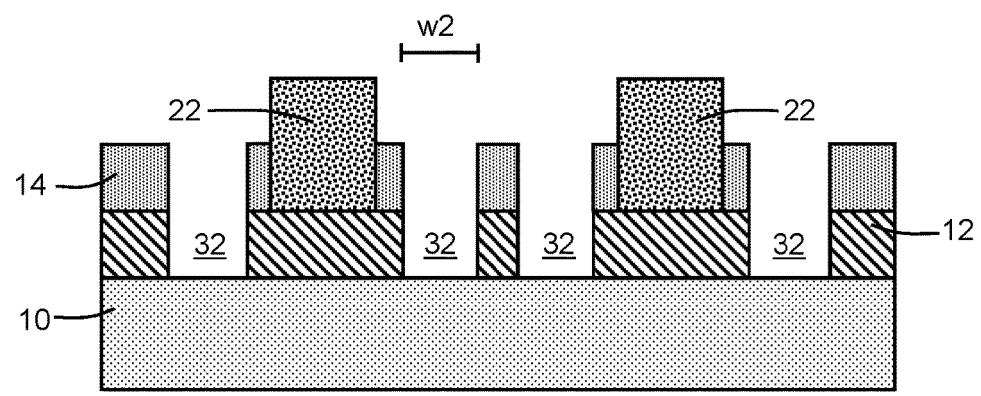

With reference to FIG. 8 in which like reference numerals refer to like features in FIG. 7 and at a subsequent fabrication stage of the processing method, the hardmask layer 16 is etched with an anisotropic etching process, such as reactive ion etching (RIE), that removes the material of the hardmask layer 16 selective to the materials of the hardmask layer 14 and the block masks 22, which collectively function as an etch mask. The hardmask layer 12 is etched with an anisotropic etching process, such as reactive ion etching (RIE), that removes the material of the hardmask layer 12 selective to the materials of the hardmask layer 14 and the block masks 22. The widened lines 30 are transferred from the hardmask layer 14 to the hardmask layer 12 as lines 32, which have a width that is equal to the width of the lines 30. The etch selectivity relative to the block masks 22 maintains the length dimensions of the end-to-end cuts in the lines 32 at the locations of the block masks 22.

Figure 9:
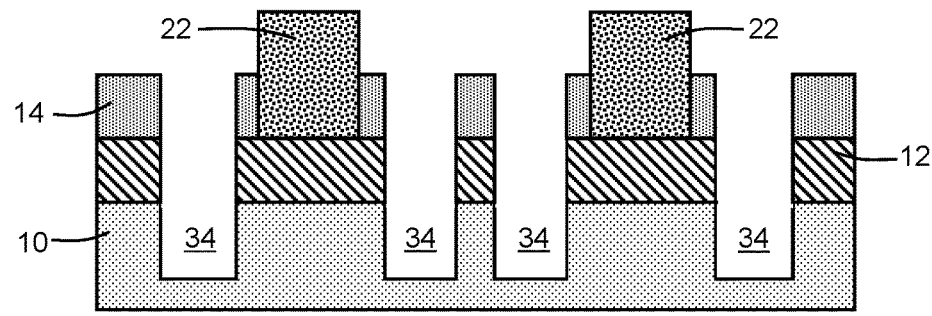

With reference to FIG. 9 in which like reference numerals refer to like features in FIG. 8 and at a subsequent fabrication stage of the processing method, the interlayer dielectric layer 10 is etched using the patterned hardmask layers 12, 14 and the block masks 22 as an etch mask to pattern the interlayer dielectric layer 10 and thereby form trenches 34 in the interlayer dielectric layer 10 at the locations of the lines 32. The trenches 34 have a width that is equal to the width of the lines 32. The hardmask layer 14 and the block mask 22 may or may not be etched away during the etch of the interlayer dielectric layer 10.

Figure 10:
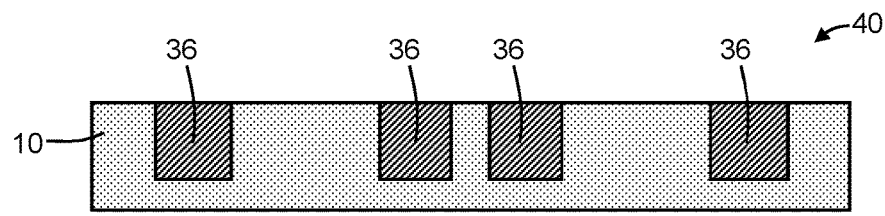
Figure 10A:
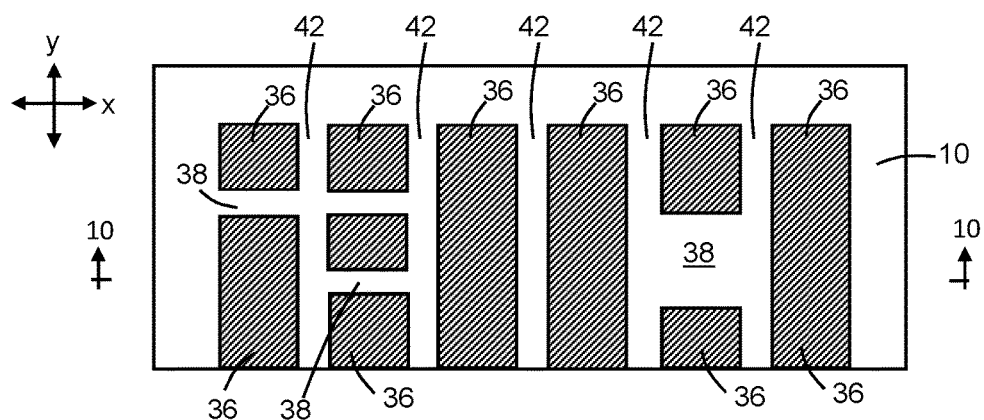

With reference to FIGS. 10, 10A in which like reference numerals refer to like features in FIG. 9 and at a subsequent fabrication stage of the processing method, after the interlayer dielectric layer 10 is etched, the hardmask layers 12, remnants of the hardmask layer 14, and the block masks 22 may be removed by one or more etching or cleaning processes selective to the material of the interlayer dielectric layer 10. A back-end-of-line (BEOL) interconnect structure 40 is formed by filling the trenches 34 (FIG. 9) in the interlayer dielectric layer 10 with a conductor to form wires or interconnects 36 as features that are embedded in the interlayer dielectric layer 10. A liner (not shown) comprised of titanium (Ti), titanium nitride (TiN), tantalum (Ta), tantalum nitride (TaN), cobalt (Co), ruthenium (Ru), copper (Cu), or a layered combination of these materials (e.g., a bilayer of TaN/Ta) may be applied to the trenches 34 before filling with the primary electrical conductor. The primary conductor may be comprised of a low-resistivity metal formed using a deposition process, such as copper (Cu), ruthenium (Ru), or cobalt (Co) formed by electroplating or electroless deposition. The shapes and geometries of the interconnects 36 reflect the areas exposed for trench formation in the interlayer dielectric layer 10 by the patterned hardmask layers 12, 14 and the block masks 22.

Tip-to-tip cuts or gaps 38 (i.e., end-to-end cuts or gaps) are arranged between linearly-aligned interconnects 36 at the former locations of the block masks 22. The tip-to-tip cuts or gaps 38 have an end-to-end distance in the y-direction parallel to the length of the interconnects 36 between the end surfaces of separated interconnects 36 that is equal to the respective lengths of the block masks 22. The interconnects 36 have a width that is dimensionally equal to the width of the lines 32 in the hardmask layer 14, and the interconnects 36 are separated in the x-direction by spaces 42 that are dimensionally equal to the spaces between the lines 32. The interconnects 36 are wider than the lines 28 that are initially printed in the hardmask layers 14 and 16 but have the same pitch, and the spaces 42 are narrower than the spaces 29 associated with the lines 28. The narrow lines 30 and the wide spaces 29 patterned in the hardmask layer 14, as well as the resizing of the lines 30 (FIG. 7), cooperate to reduce edge placement error, which could otherwise cause unintentionally partial cuts in the interconnects 36, by increasing the overlay tolerance.

While described in the context of patterning a BEOL interconnect structure 40, the process flow may be used to pattern other types of structures during integrated circuit and semiconductor device fabrication. As examples, the process flow may be used to pattern structures during FEOL processing, pattern structures during middle-of-line (MOL) processing, etc.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" or "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   depositing a first hardmask layer on a second hardmask layer;
   forming a cut that penetrates through the first hardmask layer and the second hardmask layer;
   forming a block mask in the cut;
   patterning the first hardmask layer to form a plurality of first lines penetrating through the first hardmask layer to the second hardmask layer with at least one of the first lines superimposed on the block mask;

after patterning the first hardmask layer, patterning the second hardmask layer to transfer the first lines from the first hardmask layer to the second hardmask layer to form a plurality of second lines penetrating through the second hardmask layer; and etching the second hardmask layer with an isotropic etching process that removes the second hardmask layer selective to the first hardmask layer such that the second lines are widened relative to the first lines.

2. The method of claim 1 wherein the second hardmask layer is arranged on a third hardmask layer, and further comprising:

after etching the second hardmask layer, patterning the third hardmask layer to transfer the second lines from the second hardmask layer to the third hardmask layer as a plurality of third lines in the third hardmask layer, wherein a section of the third hardmask layer is masked by the block mask during the patterning of the third hardmask layer, and the section of the third hardmask layer interrupts at least one of the third lines as a cut.

3. The method of claim 2 further comprising:

before the third hardmask layer is patterned, removing the first hardmask layer selective to the second hardmask layer and the block mask.

4. The method of claim 2 wherein the third hardmask layer is arranged on an interlayer dielectric layer, and further comprising:

after patterning the third hardmask layer, patterning the interlayer dielectric layer to transfer the third lines from the third hardmask layer to the interlayer dielectric layer as a plurality of trenches in the interlayer dielectric layer, wherein a section of the interlayer dielectric layer is masked by the block mask and the section of the third hardmask layer, and the section of the interlayer dielectric layer defines a cut between a linearly-aligned pair of the trenches.

5. The method of claim 1 wherein the isotropic etching process used to pattern the second hardmask layer removes the second hardmask layer selective to the block mask.

6. The method of claim 5 wherein the second hardmask layer is formed on a third hardmask layer, and the isotropic etching process used to etch the second hardmask layer removes the second hardmask layer selective to the third hardmask layer.

7. The method of claim 1 wherein the first hardmask layer is composed of a metal, the second hardmask layer is composed of a first dielectric material, and the block mask is composed of a second dielectric material.

8. The method of claim 7 wherein the metal is titanium nitride, the first dielectric material is silicon dioxide, and the second dielectric material is silicon nitride.

9. The method of claim 1 wherein the first hardmask layer includes a plurality of sections that are respectively arranged in spaces between adjacent pairs of the first lines, and the sections of the first hardmask layer have dimensions that are unchanged when the second hardmask layer is etched by the isotropic etching process.

10. The method of claim 9 wherein the block mask has dimensions that are unchanged when the second hardmask layer is etched by the isotropic etching process.

11. The method of claim 1 wherein the block mask has dimensions that are unchanged when the second hardmask layer is etched by the isotropic etching process.

12. The method of claim 1 wherein the block mask is superimposed on more than one of the first lines.

13. The method of claim 1 wherein forming the block mask in the cut comprises:

depositing a layer of a gap-fill material having a section that fills the cut; and removing the gap-fill material from a top surface of the first hardmask layer.

14. The method of claim 1 wherein the second hardmask layer is formed on a third hardmask layer, the cut penetrates through the first hardmask layer and the second hardmask layer to expose an area of the third hardmask layer, and forming the block mask in the cut comprises:

selectively growing a section of material from the area of the third hardmask layer to fill the cut.

15. The method of claim 1 wherein the second hardmask layer is arranged over an interlayer dielectric layer, and further comprising:

after etching the second hardmask layer, patterning the interlayer dielectric layer to transfer the second lines to the interlayer dielectric layer as a plurality of trenches in the interlayer dielectric layer, wherein a section of the interlayer dielectric layer is masked by the block mask and defines a cut between a linearly-aligned pair of the trenches.

16. The method of claim 15 wherein the isotropic etching process is controlled to establish a width for the second lines, and the trenches in the interlayer dielectric layer are patterned with the width.

17. The method of claim 1 wherein the first hardmask layer is patterned by a first anisotropic etching process that removes the first hardmask layer selective to the block mask and the second hardmask layer.

18. The method of claim 17 wherein the second hardmask layer is patterned by a second anisotropic etching process that removes the second hardmask layer selective to the first hardmask layer when the second lines are formed in the second hardmask layer.

19. The method of claim 1 wherein the second hardmask layer is patterned by an anisotropic etching process that removes the second hardmask layer selective to the first hardmask layer when the second lines are formed in the second hardmask layer.

20. The method of claim 19 wherein the isotropic etching process used to pattern the second hardmask layer removes the second hardmask layer selective to the block mask.

* * * * *